United States Patent
Aggarwal et al.

(10) Patent No.: US 6,265,230 B1
(45) Date of Patent: Jul. 24, 2001

(54) METHODS TO CURE THE EFFECTS OF HYDROGEN ANNEALING ON FERROELECTRIC CAPACITORS

(75) Inventors: Sanjeev Aggarwal, Silver Spring; Scott Robert Perusse, West River; Ramamoorthy Ramesh, Silver Spring, all of MD (US)

(73) Assignees: Telcordia Technologies, Inc., Morristown, NJ (US); University of Maryland at College Park, College Park, MD (US)

( * ) Notice: Subject to any disclaimer, the term of this patent is extended or adjusted under 35 U.S.C. 154(b) by 0 days.

(21) Appl. No.: 09/488,023

(22) Filed: Jan. 20, 2000

Related U.S. Application Data

(60) Division of application No. 09/151,903, filed on Sep. 11, 1998, which is a continuation-in-part of application No. 08/871,059, filed on Jun. 9, 1997.

(51) Int. Cl.[7] ..................................................... H01L 21/00
(52) U.S. Cl. .................................................. 438/3; 438/393
(58) Field of Search .......................................... 438/3, 393

(56) References Cited

U.S. PATENT DOCUMENTS

| | | | |
|---|---|---|---|
| 3,599,060 | * 8/1971 | Maniuls et al. | 257/751 |
| 5,777,356 | 7/1998 | Dhote et al. | 257/295 |
| 5,798,903 | 8/1998 | Dhote et al. | 361/321.4 |
| 5,851,841 | * 12/1998 | Ushikubo et al. | 438/240 |
| 5,943,568 | * 8/1999 | Fujii et al. | 438/240 |

OTHER PUBLICATIONS

Han et al., "Electrode dependence of hydrogen–induced degradation in ferroelectric Pb(Zr,Ti)O3 and SrBi2Ta2O9 thin films," *Applied Physics Letters*, vol. 71, No. 9, 1997, pp. 1267–1269.

Kushida–Abdelghafar et al., "Electrode–induced degradation of Pb(ZrxTi1–x)O3 (PZT) polarization hysteresis characteristics in Pt/PZT/Pt ferroelectric thin–film capacitors," *Applied Physics Letters*, vol. 69, No. 21, 1996, pp. 3188–3190.

Shimamoto et al., "H2 damage of ferroelectric Pb(Zr, Ti)O3 thin–film capacitors—The role of catalytic and adsorptive activity of the top electrode," *Applied Physics Letters*, vol. 70, No. 23, 1997, pp. 3096, 3097.

\* cited by examiner

*Primary Examiner*—Wael Fahmy
*Assistant Examiner*—William M. Brewster
(74) *Attorney, Agent, or Firm*—David A. Hey

(57) ABSTRACT

A ferroelectric memory cell integrated with silicon circuitry which require a forming-gas anneal of the silicon circuitry after the ferroelectric stack has been formed. The ferroelectric layer may have a composition such that there is no space in the lattice of the ferroelectric phase to accommodate atomic hydrogen or have a composition with a Curie temperature below the temperature of the forming-gas anneal. Preferably, there is no upper platinum electrode, or it is deposited after the forming-gas anneal. A metal-oxide upper electrode serves as barrier to the forming-gas anneal, and an intermetallic layer positioned above the ferroelectric stack serves as an even better barrier. Forming-gas damage to the ferroelectric stack can be removed by a recovery anneal in a hydrogen-free environment, preferably performed at a temperature above the Curie temperature.

7 Claims, 6 Drawing Sheets

METHODS TO CURE THE EFFECTS OF HYDROGEN ANNEALING ON FERROELECTRIC CAPACITORS

RELATED APPLICATION

This application is a divisional application of Ser. No. 09/151,903, filed Sep. 11, 1998, which is a continuation-in-part of Ser. No. 08/871,059, filed Jun. 9, 1997.

FIELD OF THE INVENTION

The invention relates generally to semiconductor integrated circuits including ferroelectric memory cells. The invention relates particularly to ferroelectric memory elements integrated on a silicon substrate.

BACKGROUND ART

Ferroelectric memory circuits have been proposed as a substitute for silicon memory circuits, such as dynamic random access memory (DRAM), static random access memory (SRAM), and electrically alterable read-only memory (EAROM). DRAM is the most inexpensive of these memories, but it needs to be refreshed every few milliseconds and is considered to be relatively slow. SRAM needs no refreshing as long as the power stays applied, and it is relatively fast, but it requires a large amount of power relative to DRAM. Furthermore, its memory states disappear if power is removed. EAROM has generally high access rates, and it is non-volatile upon the removal of power, but its writing time is slow and the number of writing cycles is generally limited. Furthermore, it does not form in dense integrated circuits.

Ferroelectric memory (FRAM) offers the promise of overcoming the limitations stated above. FRAM is based on the same fundamental storage concept as DRAM, a storage capacitor in which is stored or not stored a charge representing a memory state. However, in a FRAM the capacitor core includes a ferroelectric material that can be electrically poled into either of two stable polarization states. Once poled into one of these states, the ferroelectric capacitor remains in that state even if power is removed, and its charge state can be read after the FRAM is subsequently powered up. As a result, it provides the non-volatile storage representative of EAROM. However, it can generally be read and written at speeds representative of DRAM and SRAM. It offers much lower power consumption than DRAM or SRAM because no powering or refreshing is required for storage. Furthermore, the high charge storage available in the ferroelectric material of dielectric constant and the resemblance to DRAM means that FRAM memories can be integrated to very high densities. Yet further, the high charge storage increases the cell's resistance to various types of radiation effects.

However, if FRAM it to be commercially viable, it must be integrated on silicon substrates, either so that the silicon provides support functions such as read, write, and gating circuitry for large-scale FRAM or so that the FRAM serves as auxiliary memory for silicon logic. The integration of ferroelectrics with silicon has proven difficult. Two principal problems have been the diffusion of oxygen from the ferroelectric cell into the underlying silicon substrate and the deleterious effects upon the ferroelectric of the hydrogen anneal usually required for silicon integrated circuits.

Ferroelectrics are almost invariably based upon highly oxidized metal crystals or polycrystals such as $PbTi_{1-x}Zr_xO_3$ (PZT). PZT has a simple lattice structure represented in the crystalline unit cell representation in FIG. 1, which is a tetragonal unit cell having equal a and b axes and a slightly larger c axis so that the cell is approximately cubic. The lead (Pb) atoms 10 having a charge state of +2 occupy the corners of the tetragonal cell, the oxygen (O) atoms 12 having a charge state of −2 occupy the faces of the cell, and the titanium (Ti) or zirconium (Zr) atom having a charge state of +4 occupies approximately the cell center. Above the Curie temperature ($T_c$), the cell is cubic (a=b=c), but below the Curie temperature the cell assumes the somewhat non-cubic structure of FIG. 1. The Ti or Zr atom does not occupy the exact center of the cell but instead can occupy one of two equivalent positions 14a, 14b slightly above or below the center along the c-axis. Both of these states are stable under operational conditions and represent the two polarization states of the Ti and Zr cations relative to the O anions. Other ferroelectrics have different and possibly more complex structures, but most have a structure sharing chemical effects with those of PZT.

A thin layer of a ferroelectric material such as PZT is typically deposited or at least annealed in a high-temperature, oxygen-rich ambient. Usually, the temperature is above the Curie temperature, which for PZT is about 390° C. For silicon integration, the ferroelectric layer is deposited and processed after the silicon level has been processed. Such high-temperature processing in an oxygen environment is considered to be disadvantageous if not fatal for a silicon circuit.

In the older, conventional techniques for fabricating ferroelectric cells, the ferroelectric layer is deposited by sol-gel or other processes which produce a randomly oriented polycrystalline ferroelectric layer. This crystalline structure has the disadvantage of large inter-granular boundaries along which oxygen can propagate from the oxygen-rich ferroelectric to the underlying silicon, at the boundary of which the oxygen and silicon react to form silicon dioxide, producing a strongly electrically insulative layer. Platinum (Pt) has long been proposed as an interfacial barrier between the ferroelectric and the underlying silicon. Although platinum is a relatively noble material, it has been found to be a poor barrier for oxygen migration from the ferroelectric to the underlying silicon.

Ramesh and his group have disclosed in various patents and publications (see, for example, U.S. Pat. No. 5,798,903) the technique of avoiding the problems associated with polycrystalline ferroelectrics by epitaxially growing a crystallographically oriented ferroelectric layer on a metal-oxide layer, which also acts as an electrode. The metal-oxide layer either itself provides a crystallographically templating function or is epitaxially grown on another crystallographically templating layer. A templating layer self-aligns to a thermodynamically preferred crystalline orientation, even when grown on an unaligned substrate, and thereafter serves as a crystallographic template for epitaxial growth of over layers. The early templating layers were the layered (distinctly non-cubic) perovskites, but cubic perovskites, such as lanthanum strontium cobalate (LSCO) have been shown to effectively template after grown perovskite layers. The crystallographically oriented ferroelectric layer reduces the area of inter-granular boundaries, thus reducing the amount of oxygen diffusion from the growing ferroelectric to the underlying silicon. Furthermore, Dhote and Ramesh in U.S. Pat. No. 5,777,356, incorporated herein by reference in its entirety, have disclosed the use of an effective barrier to oxygen diffusion placed between the lower metal oxide electrode and the silicon, specifically an intermetallic metal such as $Ti_3Al$, although many other compositions are possible.

A ferroelectric random access memory (FRAM) cell 20 is illustrated in the cross-sectional view of FIG. 2. Many such memory cells are formed in an integrated circuit memory together with silicon-based support circuitry on a <001>-oriented crystalline silicon substrate 22. Each cell includes both a ferroelectric capacitor and a silicon transistor gating the ferroelectric capacitor to read and write lines. The metal-oxide-semiconductor (MOS) transistor is created in part by forming source and drain wells 24, 26 having a conductivity type opposite to that of the substrate 22. The intervening gate region is overlaid with a gate structure 28 including an unillustrated thin gate oxide facing the silicon gate region G and an unillustrated upper metal gate line, for example of aluminum, to control the gate.

A first inter-level dielectric layer 30 is deposited over the substrate and the transistor structure. A through hole 32 is etched through the first inter-level dielectric layer 30 in the area over the source well 24, and polysilicon is filled into the through hole 32 to form a polysilicon contact plug to the transistor source. A metal source line 34 is photolithographically delineated on top of the first inter-level dielectric layer 30 and electrically contacts the polysilicon plug 32.

A second inter-level dielectric layer 36 is then deposited over the first inter-level dielectric layer 30. Another through hole 38 is etched through both the first and second inter-level dielectric layers 30, 36 over the area of the drain well 26, and polysilicon is filled into the second through hole 38 to form a contact plug to the transistor drain.

A lower ferroelectric stack is then deposited and defined over the polysilicon plug 38. It includes a polysilicon layer 40 to promote electrical contact to the polysilicon plug 38, a titanium nitride (TiN) layer 42 acting as a first conductive barrier between the underlying polysilicon 40 and the oxidizing ferroelectric layer and its oxide electrodes, an intermetallic layer 44 acting as the primary barrier, and a lower metal-oxide electrode 46.

Growth of the metal-oxide electrodes 46, 52 and the ferroelectric layer 50 is performed at temperatures in the range of 500° to 650° C., the highest temperatures achieved in the processing after the deposition of the intermetallic layer 44.

A field-oxide layer 48 is formed around the sides of the lower ferroelectric stack and extends over its rim and laterally outwards from its bottom but leaves a central aperture for the after deposited upper ferroelectric stack.

The upper ferroelectric stack is then deposited and defined to fill the aperture in the field oxide layer 48 but not to extend beyond the end of its foot. The upper ferroelectric stack includes the ferroelectric layer 50, the upper metal-oxide electrode layer 52, and a platinum layer 54. Although the illustrated ferrolectric layer has a composition of lead niobium zirconium titanate (PNZT), the following discussion will use the simpler lead zirconium titanate ($PbZr_xTi_{1-x}O_3$ or PZT). The upper and lower metal oxide electrodes 46, 52 are preferably formed of lanthanum strontium cobalate (LSCO) of the approximate composition $LaSr_{0.5}Co_{0.5}O_3$. LSCO not only acts as a conductive metal oxide electrode, but it also provides a fairly strong crystallographic templating function.

A third inter-layer dielectric layer 56 is deposited around the upper and lower ferroelectric stacks. A via hole 60 is etched down to the platinum layer 54, and Ti/W is filled into the hole to form a via 60 contacting the platinum layer 54. An aluminum layer is deposited and delineated to form an interconnect line 62 connected to the via 60.

Although the structure shown in FIG. 2 offers many operational advantages, it has been difficult to integrate the ferroelectric structure with conventional silicon circuitry. It has long been known in silicon processing that dangling oxygen bonds tend to form at the interface between the silicon substrate 22 and overlying silicon oxide, such as in the field oxide 30 and the gate oxide in the transistor gate structure 28. Such dangling bonds tend to accumulate charge and shift the transistor threshold voltages, rendering the transistor leaky, hard to control, and at worst inoperable. However, it has also long been long known that the interfacial bonds can be tied up by an anneal in a hydrogen environment in the vicinity of 200 to 400° C. after the formation of the oxide/silicon interface. A typical annealing ambient is 4% hydrogen in nitrogen. It is believed that the very mobile hydrogen atoms quickly diffuse through the overlying oxide and bond with the free oxygen bonds. This anneal is often referred to as a forming-gas anneal although hydrogen in a nitrogen carrier is the predominant forming gas used. The forming-gas anneal also reduces the level of defects in the material, such as may result from ion implantation of the source and drain.

The integrated ferroelectric memory structure of FIG. 2 also needs to be subjected to a forming-gas treatment because of the active silicon circuitry overlaid by the oxide layer 30. However, in this structure the platinum electrode acts as a catalyst to reduce molecular hydrogen $H_2$ to atomic hydrogen H, which is thus freely available in the upper area of the ferroelectric capacitor, and atomic hydrogen is extremely mobile.

It is known that the perovskite ferroelectric layer and the metal-oxide electrode layers are best deposited in a highly oxidizing environment at temperatures between about 500 and 650° C. In the parent application, incorporated herein by reference in its entirety, Aggarwal et al. disclose the advantage of a post-deposition rapid thermal anneal (RTA) at 750° C., which is performed in an air or oxygen ambient. If the silicon circuitry experiences these temperatures, particularly in an oxygen-rich ambient, after the forming-gas anneal, whatever hydrogen has bonded at the oxide/silicon is likely to debond and diffuse back out of the wafer. Therefore, it seems inevitable that the forming-gas anneal be performed after the perovskite deposition and RTA. That is, the ferroelectric stack will be exposed to the forming-gas anneal.

However, ferroelectric capacitors react poorly to the forming-gas anneal and tend to lose their hysteretic characteristics required for ferroelectric memory. Furthermore, the damage seems to be accelerated with the upper platinum electrode in the more conventional Pt/PZT/Pt ferroelectric stack. See, for example: (1) Kushida-Abdelghafar et al., "Electrode-induced degradation of $Pb(Zr_xTi_{1-x})O_3$ (PZT) polarization hysteresis characteristics in Pt/PZT/Pt ferroelectric thin-film capacitors," *Applied Physics Letters*, vol. 69, no. 21, 1996, pp. 3188–3190; (2) Shimamoto et al., "$H_2$ damage of ferroelectric $Pb(Zr, Ti)O_3$ thin-film capacitors—The role of catalytic and adsorptive activity of the top electrode," *Applied Physics Letters*, vol. 70, no. 23, 1997, pp. 3096, 3097; and (3) Han et al., "Electrode dependence of hydrogen-induced degradation in ferroelectric $Pb(Zr,Ti)O_3$ and $SrBi_2Ta_2O_9$ thin films," *Applied Physics Letters*, vol. 71, no. 9, 1997, pp. 1267–1269. These articles associate the hydrogen-induced ferroelectric degradation with the platinum top electrode catalyzing molecular hydrogen to produce atomic hydrogen, which then reduces PZT at the PZT/Pt interface, thereby removing oxygen from the oxide ferroelectric. Shimamoto et al. suggest using instead a top electrode of gold or silver. Han et al. seem to suggest recovering the forming-gas damage with a 450° C. recovery anneal in oxygen. However, they do not address the effect of the recovery anneal on characteristics of the oxide/silicon interface, the reason for the forming-gas anneal.

Accordingly, it is greatly desired to provide the integration of ferroelectric capacitors with silicon integrated circuits. In particular, it is desired to provide either a method or a structure that prevents the damage of ferroelectric effects by a forming-gas anneal.

SUMMARY OF THE INVENTION

The invention may be summarized as methods and structures used singly or in combination to overcome the effects of a forming-gas (hydrogen) anneal used in the fabrication of silicon integrated circuits on ferroelectric capacitors.

In a first aspect of the invention, the ferroelectric composition is chosen to have lattice spacings not allowing space for incorporation of an interstitial hydrogen atom below the Curie temperature.

In a second aspect of the invention, the ferroelectric composition is chosen to have a Curie temperature below the temperature of the forming-gas anneal, or the temperature of the anneal is readjusted to satisfy this condition. The ambient should be kept hydrogen free as the sample is cooled below the Curie temperature.

In a third aspect of the invention, no platinum upper electrode is formed, at least prior to the forming-gas anneal.

In a fourth aspect of the invention, a barrier layer is formed over the ferroelectric stack prior to the forming gas anneal. The barrier may be a conductive metal oxide, which may also be used as the upper capacitor electrode. Preferably, the barrier is a layer of an intermetallic alloy.

In a fifth aspect of the invention, a recovery anneal is performed after the forming-gas anneal to undo the damage of the forming-gas. The recovery anneal is performed in a non hydrogen environment, such as pure nitrogen, and the non-hydrogen environment is maintained until the sample is cooled below the Curie temperature.

DETAILED DESCRIPTION OF THE PREFERRED EMBODIMENTS

There are a number of approaches that reduce or remove the effects of the forming-gas anneal from ferroelectric capacitors, whether they be the crystallographically oriented ferroelectrics we have promoted or the more conventional randomly oriented polycrystalline capacitor cells.

EXPERIMENT 1

In a preliminary experiment to demonstrate the effect of a forming-gas anneal, we fabricated a conventional ferroelectric cell on a platinized silicon substrate to produce the cell structure presented in TABLE 1.

TABLE 1

| Pt |
|---|
| PZT |
| Pt |
| Ti |
| $SiO_2$ |
| Si |

The ferroelectric PZT layer has a composition of $PbZr_{0.2}Ti_{0.8}O_3$. It is deposited to a thickness of about 120 nm by a sol-gel technique and annealed into the perovskite phase at 650° C. in an oxygen ambient. The top platinum electrode is deposited and patterned into 100×100 $\mu$m pads. Such structures were subjected to different anneals in forming gas of 4% $H_2$ and 96% $N_2$ (by volume) at atmospheric pressure for 30 minutes at a temperature in the range of 200 to 450° C.

Before the forming-gas anneal, the capacitors show a good S-shaped hysteresis loops with saturation at 5V and a coercive field of about 1V. With a forming-gas anneal of 200° C., the hysteresis curve significantly degrades. By 300° C., the curve is barely open. By 400° C., the polarization characteristics are substantially linear, and thus the ferroelectric capacitors are useless for memories. The PZT resistivity decreases from about $5 \times 10^{10}$ $\Omega$-cm without a forming-gas anneal to about $2 \times 10^7$ $\Omega$-cm with a 400° C. anneal, producing an unacceptable increase in the leakage current across the capacitor. These results are consistent with those reported in the literature cited above.

Such samples and similar ones were fabricated for special tests. X-ray diffraction results showed relatively little change in lattice parameters for PZT during a forming-gas anneal, thus arguing against loss of oxygen.

Figure 1:
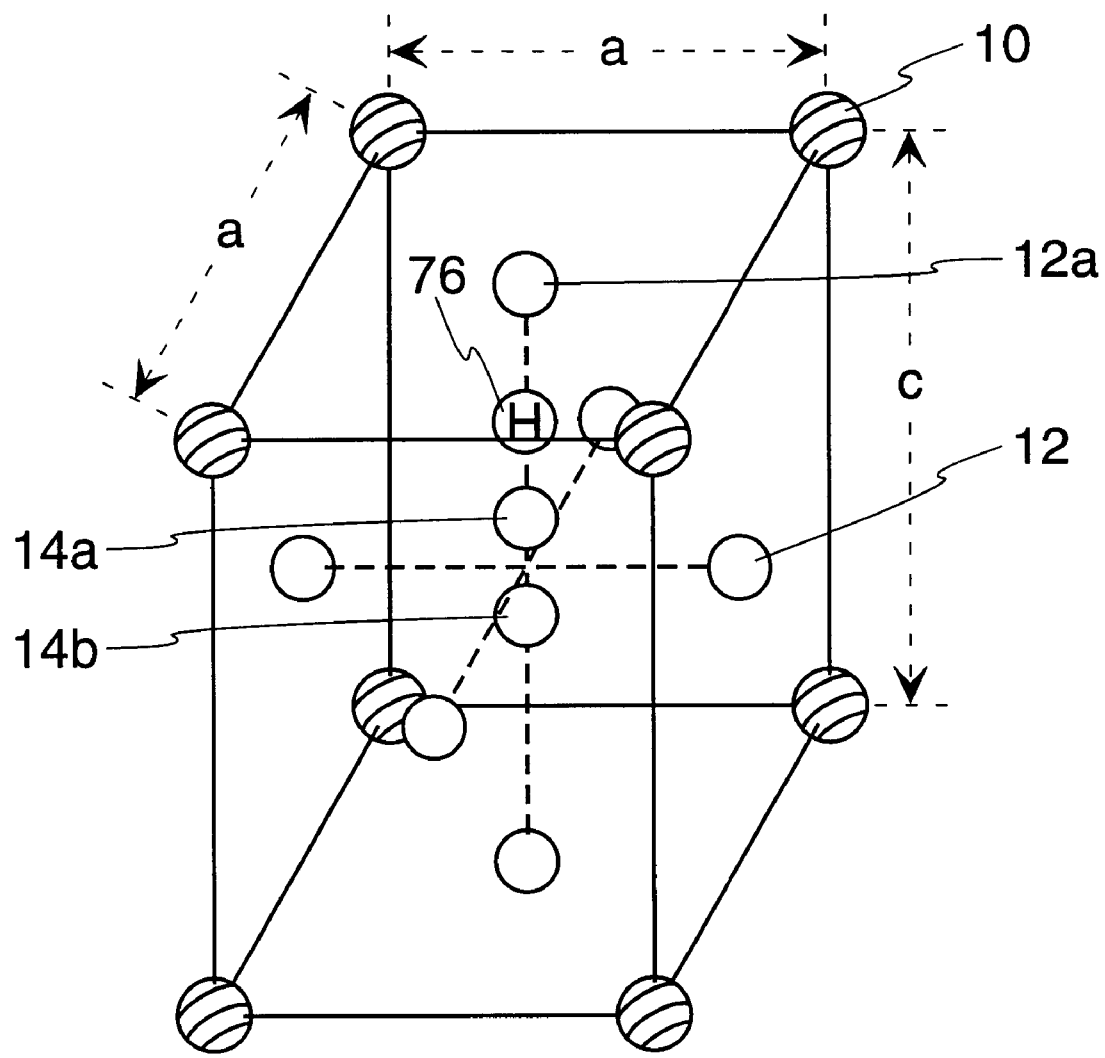
FIG. 1 is an isometric view of a unit crystalline cell of lead zirconium titanate including the two possible positions of the cation and the proposed position of interstitial hydrogen result from a forming-gas anneal.
Figure 2:
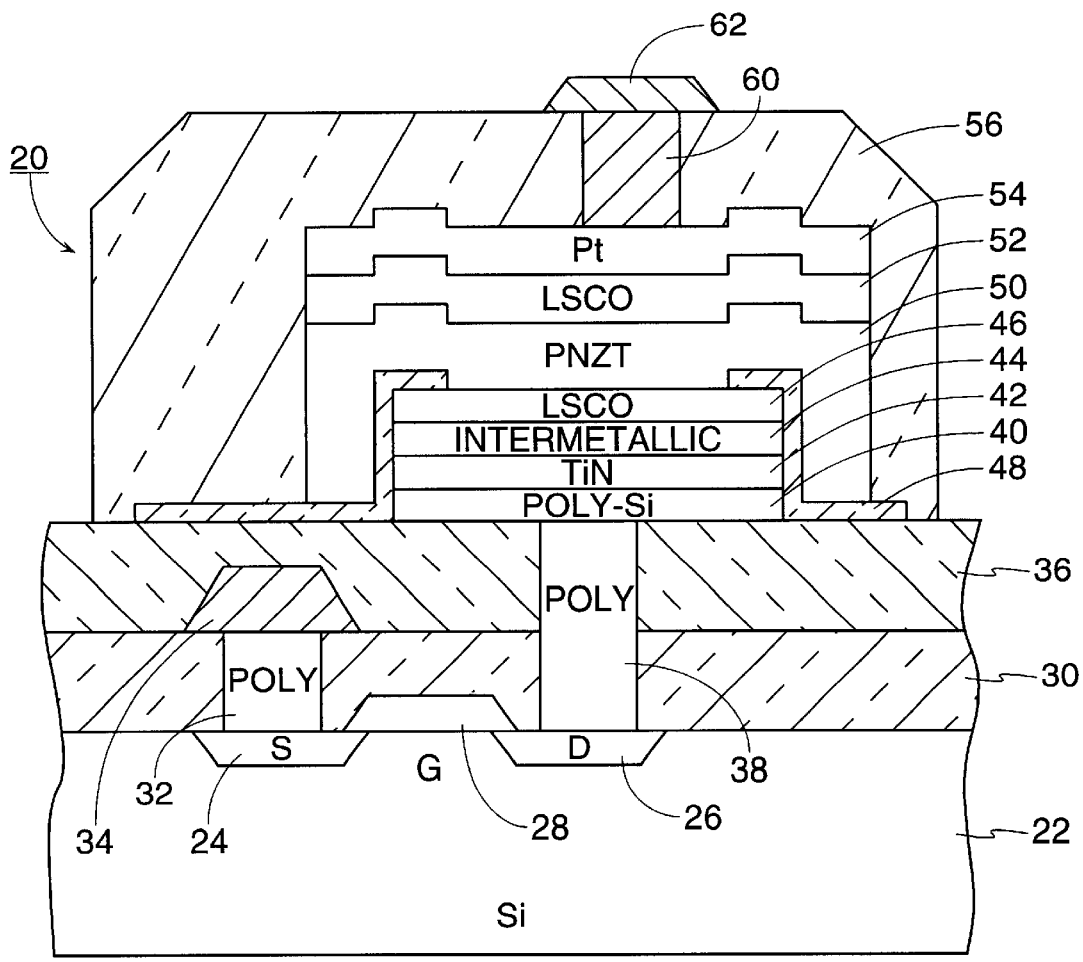
FIG. 2 is a cross-sectional view of a ferroelectric cell utilizing a lower intermetallic barrier.
Figure 5:
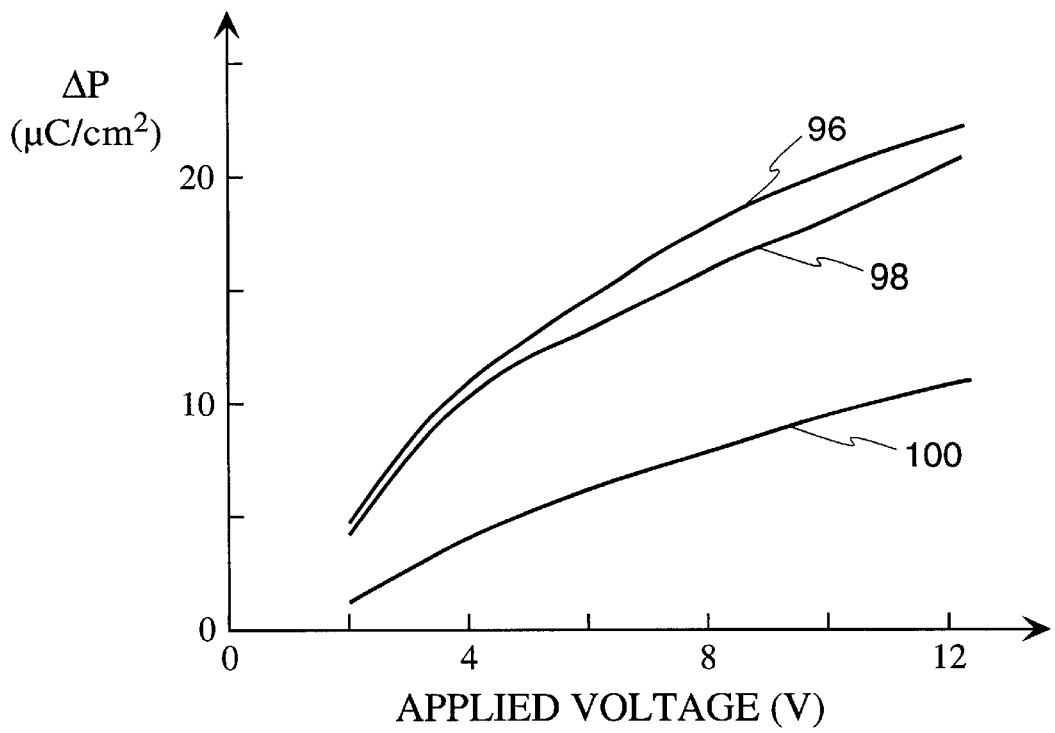
FIG. 5 is a graph showing the effect of a forming-gas anneal upon a ferroelectric having an intermetallic upper electrode.

Some samples were grown for Raman testing with the PZT epitaxially formed on LSCO over a $LaAlO_3$ substrate. On these samples, the forming-gas anneal produces a strong peak in the Raman shift at about 3700 $cm^{-1}$, which corresponds to a polar hydroxyl [OH$^-$] bond stretching mode. This feature is absent in the unannealed film. Also a depolarized peak at 920 $cm^{-1}$ is found in the annealed sample. This peak can be identified with a Ti=O bond. Based on these results, we believe that hydrogen ions are interstitially incorporated into the ferroelectric PZT lattice. In particular, we believe that the hydrogen assumes a position between the polarizable cation and the apical oxygen. As illustrated in FIG. 1 for the tetragonal lattice structure of PZT below the Curie temperature, the hydrogen from the forming-gas anneal assumes an interstitial position 76 between or possibly overlapping the upper cation position 14a and the apical oxygen atom 12a on the upper c-directed face. An equivalent hydrogen position exists below the lower cation position 14b. With such an interstitial placement, the hydrogen is likely to form an hydroxyl ion OH$^-$, and it likely prevents the cation from assuming the closer of the two positions 14$a$, 14$b$. With only one stable position available for the cation, the ferroelectric material loses the hysteretic effect for that unit cell. When enough cells are so filled with hydrogen, the polarization memory effect required for a ferroelectric memory cell disappears. The interstitial position of the hydrogen and resulting hydroxyl ion differ from the previously proposed explanation of the hydrogen reducing the oxygen and removing it from the unit cell. At temperatures above 200° C., both oxygen loss and hydroxyl bond formation are believed to be occurring. However, as will be explained with reference later to the data of FIG. 5, oxygen loss does not cause the failures observed in the forming-gas anneal of ferroelectric cells.

Oxygen loss does not seem to occur below 200° C. Furthermore, X-ray diffraction data taken before and after the forming-gas anneal show no discernible change in the PZT lattice parameter, as would be expected if oxygen were being lost. Raman spectra were measured for LSCO alone over a LaAlO$_3$ substrate and for PZT/LSCO over LaAlO$_3$. The LSCO/LaAlO$_3$ spectrum is flat, but the PZT sample show many phonon bands. The forming-gas anneal introduces one mode at 3700 cm$^{-1}$, which corresponds to a stretching mode of a polar hydroxyl bond based on other experiments for other perovskite-type crystals.

A first crystallographic approach to prevent the incorporation of the hydrogen into the ferroelectric unit cell is to select the material composition such that the hydrogen does not fit into an already formed unit cell. Taking PZT as an example, as the material is heated from room temperature to above the Curie temperature $T_c$, the material undergoes a phase transition from tetragonal to cubic. The cubic lattice parameter for PbZr$_{1-x}$Ti$_x$O$_3$ above $T_c$ is about 0.395 nm. A hard-sphere model can be assumed in which O$^{-2}$ has a radius of 0.14 nm, Ti$^{+4}$ of 0.61 nm, and [OH]$^-$ if 0.137 nm. For a hydrogen making the [OH]$^-$ to fit, the cubic lattice parameter needs to be equal to or greater than 0.399 nm. Thus, PZT above the Curie temperature cannot accept the hydrogen introduced in the forming-gas treatment. Therefore, if the forming-gas anneal is performed above $T_c$, the anneal will not affect the ferroelectric. For PbZr$_{0.2}$Ti$_{0.8}$O$_3$, the Curie temperature $T_c$, is about 390° C., which satisfies the condition for a forming-gas anneal at 400° C. or greater. However, the annealed ferroelectric structure needs to be cooled in a hydrogen-free environment, at least through the Curie temperature and down to a temperature at which hydrogen diffusion no longer is significant.

If PZT has a composition such that both above and below the Curie temperature the PZT lattice constants do not allow the incorporation of hydrogen, then the cool down can be done in hydrogen.

Zr-rich compositions of PbZr$_x$Ti$_{1-x}$O$_3$, with x>0.53, satisfies this condition of insufficient space even below the Curie temperature. At these compositions, PZT has a rhombohedral crystal structure below the Curie temperature and has lattice parameters that will not accommodate the hydrogen atom, thereby allowing the forming-gas anneal to be performed at temperatures below the Curie temperature.

Figure 3:
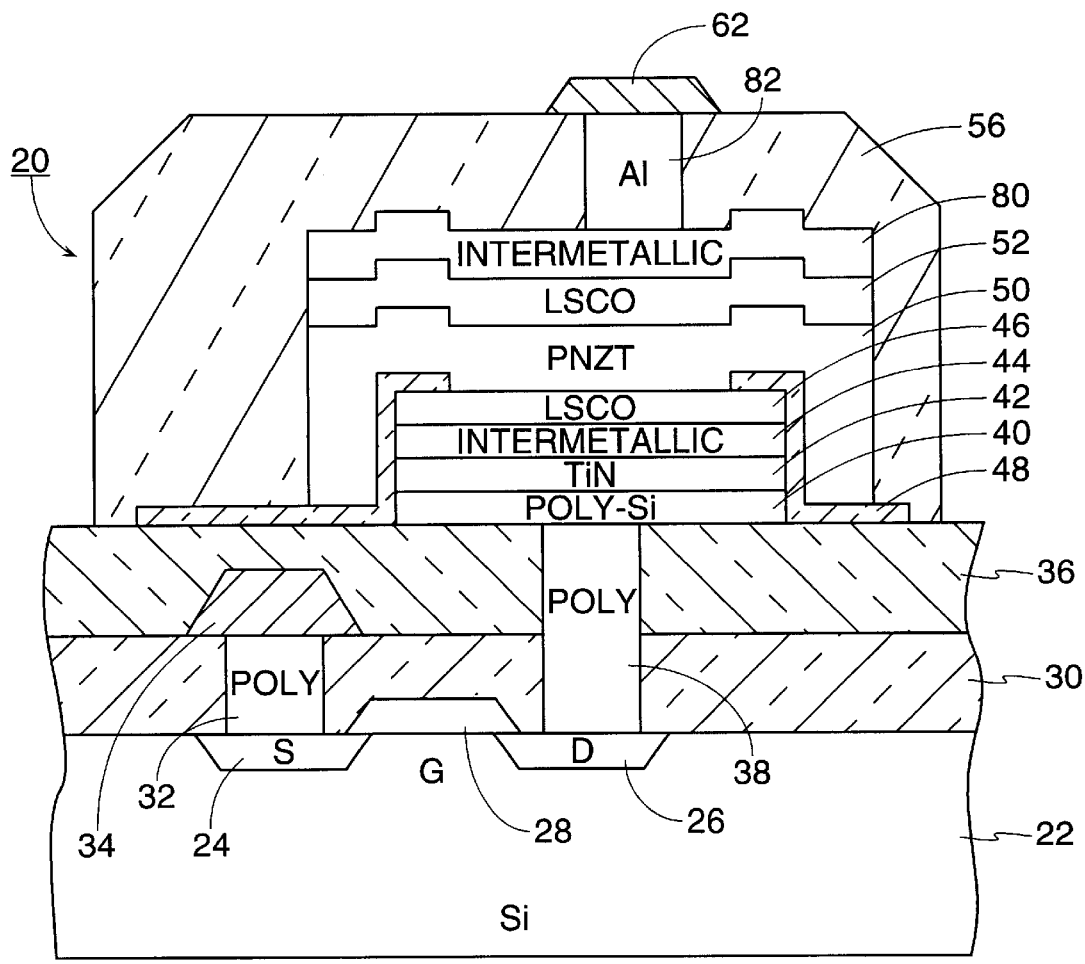
FIG. 3 is a cross-sectional view of a ferroelectric cell utilizing an upper intermetallic barrier contact.

Platinum seems to be a particularly disadvantageous top electrode for a ferroelectric cell when the forming-gas anneal is considered because of its catalysis of gaseous hydrogen into very mobile hydrogen atoms or ions. In the parent application, some of us suggested that the platinum upper electrode be replaced, as shown in the cross-sectional view of FIG. 3, with an upper aluminide intermetallic electrode 80, for example, of AlTi$_3$, Ni$_3$Al, or NiAl, so that both the upper and lower electrode layers have an intermetallic composition. This choice for the upper electrode was motivated by the use an aluminum via 82 to contact the upper electrode since the aluminide intermetallic electrode 80 would prevent the upward migration of oxygen from the LSCO upper electrode 52 and the PNZT ferroelectric layer 50 to the aluminum 82, which would create an insulating aluminum oxide interface. It is noted that the TiN layer 40 underlying the illustrated ferroelectric stack is not considered crucial and may be eliminated.

We now recognize however that the intermetallic upper electrode 80 has a wider function and applicability than simply contacting an aluminide plug. Since the upper electrode 80 in this embodiment is composed of an intermetallic alloy rather than platinum, no platinum is available to catalyze the hydrogen in the forming-gas anneal. The composition of the intermetallic upper electrode 80 is not constrained by the via 82 being composed of aluminum. Dhote et al. disclose a wide variety of intermetallic compositions in U.S. Pat. No. 5,777,356. Some preferred compositions for the intermetallic alloy are NiTi, Ni$_3$Ti, NiAl, Ni$_3$Al, Ni$_3$Nb, Nb$_3$Al, NiW, and Co$_3$Al. More general preferred families are represented by the chemical formulae AB, AB$_2$, AB$_3$, A$_2$B, and A$_3$B, where A is chosen from the group of Fe, Cr, Co, Ni, Mn, Mo, and Nb and where B is chosen from the group of Al, Ti, Cr, Si, Ru, Re, and W. Popular quaternary systems are (Co,Ni)$_3$(Al,Ti) and (Co,Ni)$_2$(AlTi). Related intermetallic alloys such as TiAl, Ti$_3$Al, TiAl$_3$, and NiCo can be characterized as AA' or BB' alloys, that is, components from only the A or B group. Alloying with other metal elements, especially V and Nb, up to 5 or 10 atomic % is well known.

The use of the intermetallic upper electrode to prevent forming-gas damage also is not limited to the LSCO electrodes and crystallographically oriented ferroelectric layers promoted in many of our earlier patents. The electrode layers may be formed of one of many metal oxides, whether they have a perovskite or other crystalline structure. The perovskites includes LSCO, La—Ni—O (as disclosed by Dhote et al. in U.S. Pat. No. 5,798,903), and Sr—Ru—O. Rutiles includes iridium oxides and ruthenium oxides. The ferroelectric layer is typically derived from the PZT group, from the group of strontium bismuth tantalate (SBT), or from the group of barium strontium titanate (BST). Although superior results are achieved with the crystallographically oriented ferroelectric layers, the invention can be applied to the more conventional polycrystalline ferroelectric layers grown by sol-gel and other processes.

The upper metal-oxide layer 52, particularly when composed of LSCO, effectively acts as a barrier to the forming-gas anneal as long as it is not overlaid with platinum during the anneal.

EXPERIMENT 2

A series of experiments were performed to demonstrate the effects of the forming-gas anneal with metal-oxide electrodes using the structure shown in TABLE 2, which resembles important portions of the ferroelectric stack of FIG. 1 beneath the upper contact layer 54. The ferroelectric layer is composed of PNZT having a composition of PbNb$_{0.04}$Zr$_{0.28}$Ti$_{0.68}$O$_3$.

TABLE 2

| LSCO |
| --- |
| PNZT |
| LSCO |
| Pt |
| Ti |
| SiO$_2$ |
| Si |

In the samples, the upper metal oxide layer was directly exposed to the forming-gas anneal and only afterwards was the upper contact layer applied. Forming-gas anneals were performed at 200° C. and 300° C. for 30 minutes. After the forming-gas anneal, if it were performed, 50 μm contact pads of platinum or the intermetallic Ti$_3$Al were deposited on the top LSCO layer and patterned, and ferroelectric and other electrical characteristics were determined.

The best ferroelectric characteristics are obtained when no forming-gas anneal is performed, although this possibility is inconsistent with the desire to integrate ferroelectric and silicon circuitry. The forming-gas anneal somewhat degrades the ferroelectric characteristics, with a 300° C. anneal producing more degradation than a 200° C. one. However, in cases both of a platinum upper contact layer and of an intermetallic upper contact layer, the degradation is acceptable, amounting to a reduction in polarization of no more than 25% and the hysteresis curves have a normal shape. Further tests on fatigue, imprint, and retention loss show no untoward results.

Thus, it is clear that the forming-gas anneal can be performed using the metal-oxide layer as a barrier before the contact layer is deposited.

Another alternative is to fabricate the ferroelectric cell structure including an intermetallic prior to the forming-gas anneal.

EXPERIMENT 3

Another series of experiments were performed on the structure presented in TABLE 3 in which no top LSCO electrode is used and in which the ferroelectric is covered with an electrode layer either of the internetallic Ti$_3$Al or of platinum, which is patterned into upper electrodes prior to the forming-gas anneal.

TABLE 3

| Pt or |
| --- |
| Intermetallic |
| PZT |
| Pt |
| Ti |
| SiO$_2$ |
| Si |

However, since the intermetallic or platinum in the test samples is patterned for capacitor cells prior to the anneal in these experiments, the underlying ferroelectric is exposed to the forming gas, particularly in the structure of the second experiment not having a top LSCO electrode.

Figure 4:
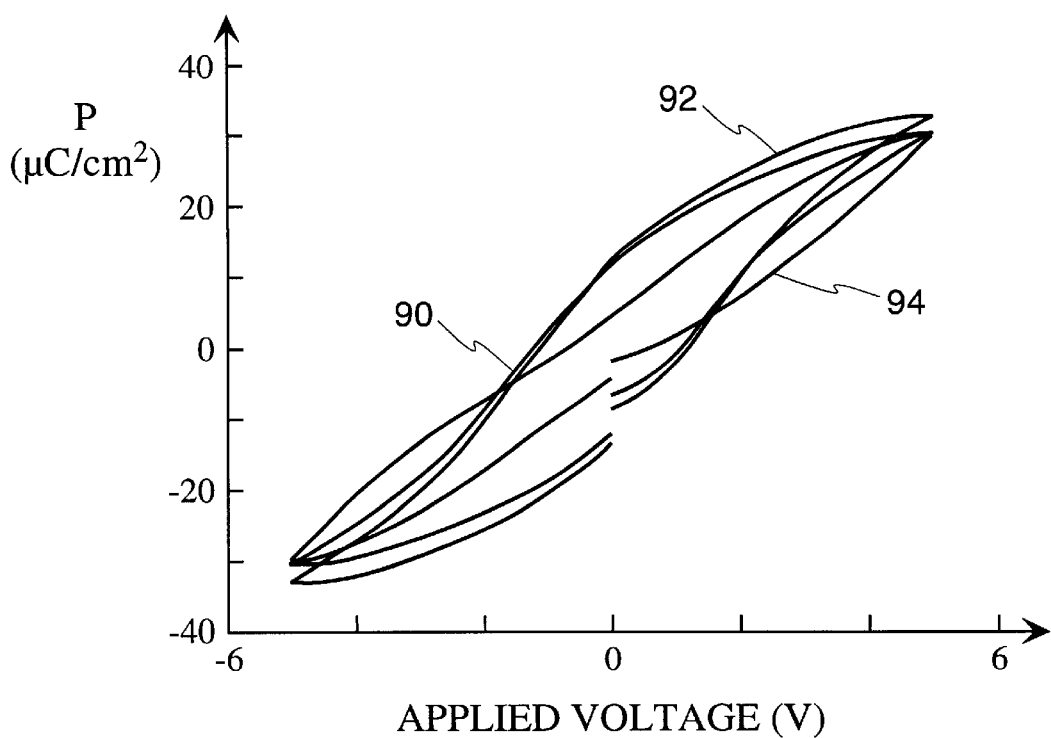
FIG. 4 is a graph containing hysteresis curves showing the effect of a forming-gas anneal upon a ferroelectric cell having different upper metal contacts.

In FIG. 4 is shown a hysteresis loop 90 measured prior to the forming-gas anneal of these experiments. The hysteresis is about the same in the unannealed samples having either platinum or intermetallic upper electrodes. Curve 92 shows the hysteresis loop for a sample with a top intermetallic contact after 30 minutes of a 200° C. forming-gas treatment. The polarization characteristics seem to improve slightly. On the other hand, curve 94 shows the hysteresis loop for a sample with a top platinum contact after the same forming-gas treatment. Ferroelectric characteristics are visible, but the degradation is unacceptable. Clearly, the intermetallic layer prevents much of the degradation produced by a platinum layer. The pulsed polarization (P*−P^) was measured for the samples with an intermetallic layer as both a function of the applied voltage and as a function of the forming-gas treatment. As shown by curve 96 in FIG. 5, the best polarization is obtained with no forming-gas anneal. Curve 98 shows the pulsed polarization after 30 minutes of a 200° C. forming-gas anneal, and curve 100 shows it after 30 minutes of a 300° C. anneal. The results for a 200° C. anneal are quite acceptable, and those for a 300° C. anneal, although degraded, still show clear ferroelectric behavior. Imprint tests were carried out on samples with intermetallic contacts for 10$^8$ single-sided pulses while the sample was held at 100° C. after a 200° C. forming-gas treatment. Some changes were observed, but they would not significantly affect the memory cell's operation.

The protection afforded by the Ti$_3$Al barrier could be improved by adding vanadium, which will further prevent the catalysis of hydrogen molecules.

Figure 6:
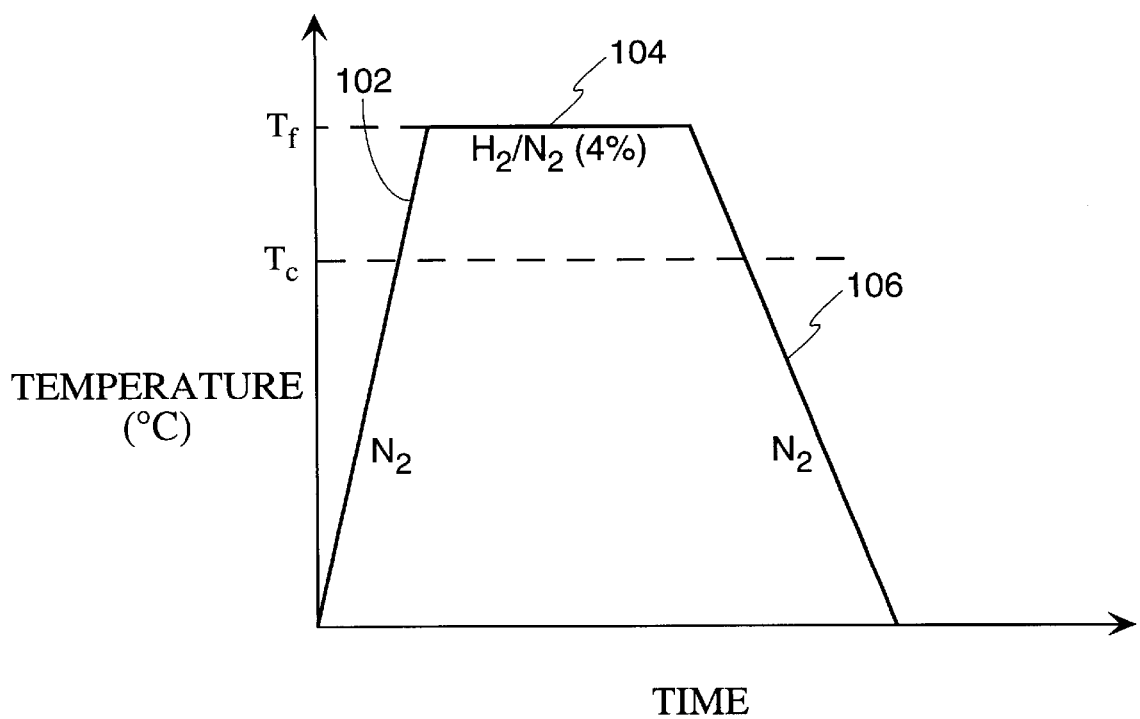
FIG. 6 is a graph illustrating a forming-gas treatment performed above the Curie temperature.

The description of the interstitial position of the hydrogen illustrated in FIG. 1, we believe, is valid only when the perovskite ferroelectric material is below the Curie temperature $T_c$, where it assumes a tetragonal crystal structure. We believe that above the Curie temperature, where the potentially ferroelectric material has a cubic crystal structure, in PZT and in some other material compositions there is insufficient room in the lattice for hydrogen to fit in, as we have described above. As a result, one way to avoid forming-gas damage to the ferroelectric is to perform the forming-gas anneal at a temperature $T_f$ that is above the Curie temperature $T_c$. As illustrated in the process flow graph of FIG. 6, which plots temperature against time, the chip with both the silicon and ferroelectric elements formed on it are introduced into the annealing furnace and the temperature is ramped up in a ramp-up period 102 to a forming-gas temperature $T_f$ above the Curie temperature $T_c$ of the ferroelectric material, $T_f > T_c$, and is held at that temperature $T_f$ during the forming-gas anneal period 104 during which the furnace is filled at atmospheric pressure with forming gas, typically H$_2$/N$_2$ with 4% hydrogen. However, the forming gas is introduced into the furnace only after the chip temperature exceeds the Curie temperature $T_c$, and preferably has reached the forming-gas temperature $T_f$. During the ramp-up period 102, the furnace is preferably filled with an inert gas such as N$_2$ or Ar.

At the end of the forming-gas treatment 104, the forming gas is replaced by an inert (or slightly oxidizing) gas before the heat is removed and the chip is subjected to a cool-down period 106 in the hydrogen-free ambient, at least while the integrated circuit chip transitions the Curie temperature $T_c$, and until the temperature is low enough that hydrogen diffusion is no longer a problem.

Although forming-gas treatments are typically performed for 30 minutes at 400° C., these values may be adjusted to satisfy the requirement of $T_f > T_c$. However, many important ferroelectric materials satisfy this condition when $T_f = 400°$ C., as indicated in TABLE 4 for the Curie temperatures $T_c$, of the listed compositions.

TABLE 4

| Composition | $T_c$ (° C.) |
|---|---|
| $PbZr_{0.2}Ti_{0.8}O_3$ | 390 |
| $PbTiO_3$ | 490 |
| $Pb_{0.9}La_{0.1}Zr_{0.2}Ti_{0.8}O_3$ | 250 |
| $Pb(Zr_{0.2}Ti_{0.8})_{0.96}Nb_{0.04}O_3$ | 250 |

For lead titanate, the Curie temperature is too high for the usual forming-gas temperature of 400° C., and for the listed composition of PZT the condition is only marginally satisfied. But, in these cases the forming-gas temperature can be raised (and probably the annealing period reduced) with due regard for the overall silicon thermal budget and maximum allowed temperature. For the listed compositions of PLZT and PNZT, the condition $T_f > T_c$ is clearly satisfied. The Curie temperature can be adjusted compositionally by, for example, adjusting the Zr/Ti ratio or by cationic substitution, for example, doping with La, Nb, etc.

Figure 7:
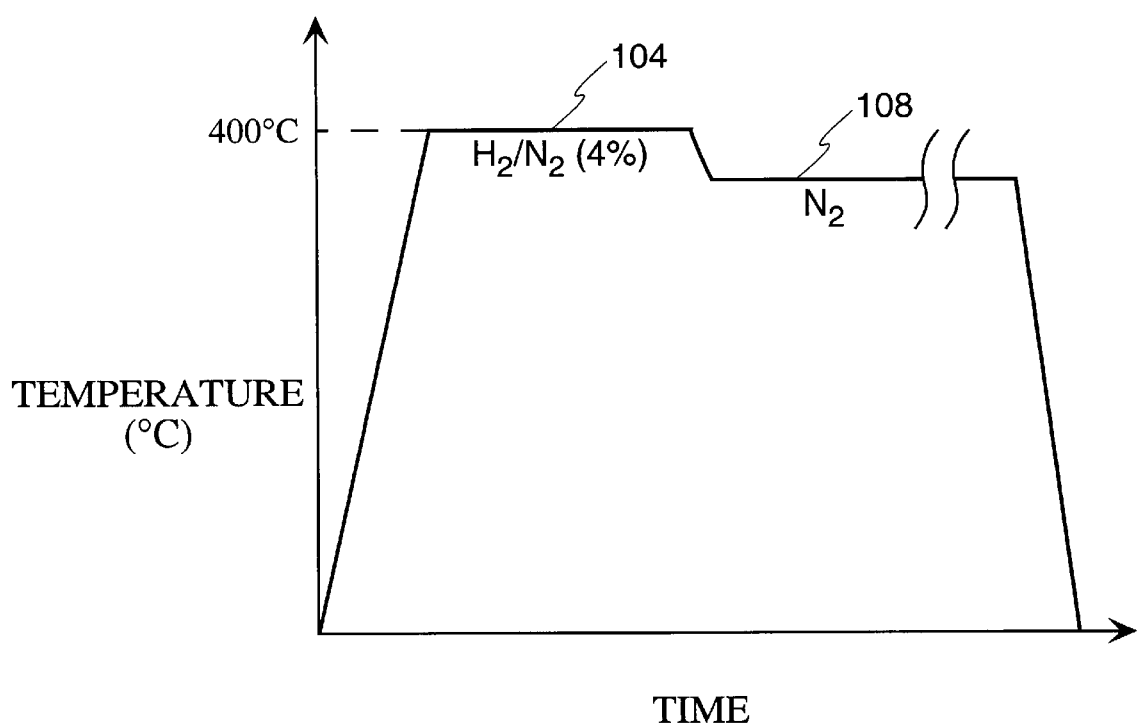
FIG. 7 is a graph illustrating recovery anneal performed after a forming-gas anneal.

A different though complementary approach to reduce the effect of hydrogen annealing on ferroelectric material is to accept the initial degradation of ferroelectric characteristics induced by the forming-gas anneal but then to recover the ferroelectric characteristics by a subsequent annealing in an inert or slightly oxidizing ambient. A process flow is illustrated in the graph of FIG. 7 illustrating the time dependence of the annealing temperature in a two-step anneal. The nearly completed ferroelectric memory including both the silicon circuitry and the ferroelectric cells are placed in an annealing furnace, and the furnace is filled with atmospheric pressure of forming gas, typically $H_2/N_2$ with 4% of hydrogen, although the ambient during ramp up is not crucial. The temperature is quickly ramped from room temperature to the temperature Tr of the forming-gas treatment, which is typically 400° C., and a first, forming-gas anneal 104 extends for about 30 minutes, as is well known in silicon processing. Then, the furnace temperature is monotonically changed to a recovery anneal temperature $T_f$, and the furnace ambient is changed for a second, recovery anneal 108. The preferred recovery ambient is VLSI grade pure nitrogen, but other gases are discussed below. The recovery temperature is in the range of 300° to 600° C., and the recovery anneal 108 extends for a time period typically in the range of 30 to 300 minutes, dependent upon the structure and composition of the integrated memory. If, as illustrated, the temperature of the recovery anneal is less than that of the forming-gas anneal, $T_{f<Tf}$, then the furnace ambient should be switched from the forming gas to the inert gas prior to the cooling down to the temperature $T_f$, of the recovery anneal.

Figure 8:
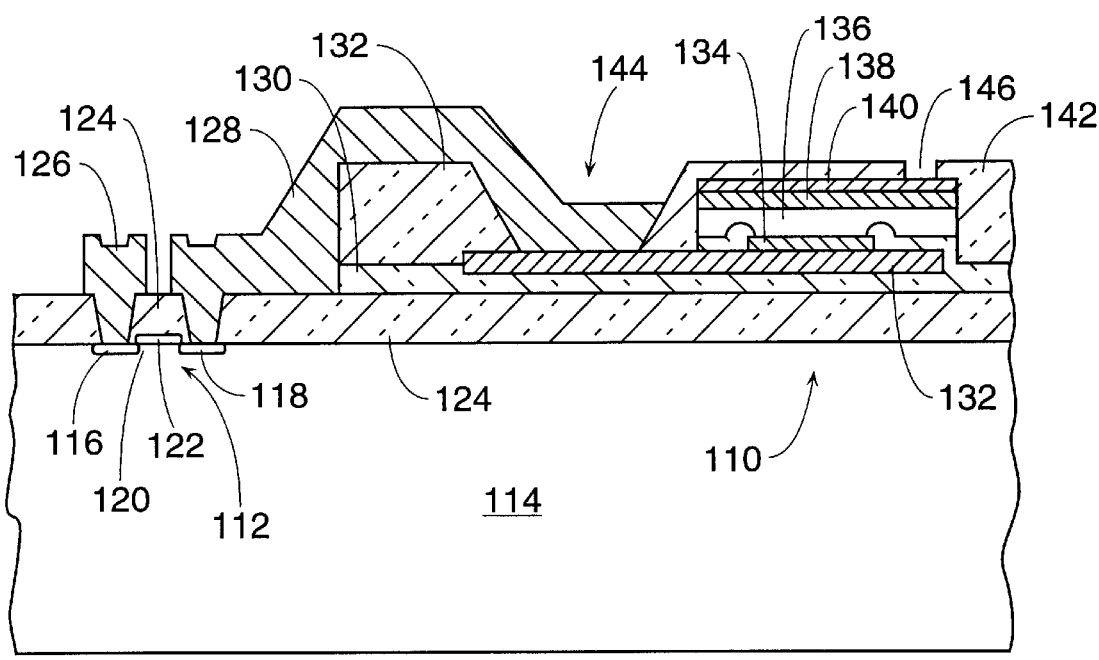
FIG. 8 is a cross-sectional view of a ferroelectric capacitor integrated with a portion of a silicon integrated circuit.

In FIG. 8 is illustrated a cross-sectional view of a ferroelectric memory capacitor 110 integrated with a CMOS transistor 112 on a silicon substrate 114. This structure was tested with a recovery anneal related to but somewhat differing from that of FIG. 7, as described below. It is understood that the illustrated integrated memory is replicated many times for a memory chip and that there is additional silicon circuitry for selecting, reading, writing, and input/output. Only part of the CMOS transistor 112 used to gate the ferroelectric memory cell 110 is illustrated, specifically source and drain wells 116, 118 bracketing a gate region 120. A metal gate 122 and an unillustrated gate oxide overlie the gate region 120 and are connected through an unillustrated horizontal interconnects to other portions of the silicon circuitry. A flow glass 124 serves as a first-level dielectric to isolate the gate 122 from a metal interconnect level, which is divided by a photolithographic step into a contact 126 to the transistor source 116 and an interconnect 128 between the transistor drain 118 and the bottom contact to the ferroelectric capacitor 110.

The flow glass 124 also extends to the area of the capacitor 110. In that area, it is overlaid with a barrier layer 130 of $TiO_2$, which is partially overlaid with a lower platinum contact layer 132. Over the lower contact layer 132 is formed the ferroelectric stack including a lower metal-oxide electrode layer 134 of LSCO, a ferroelectric layer 136 of PZT, and an upper metal-oxide electrode layer 138 of LSCO. The growth conditions for the samples of the experiment are chosen to be such that the LSCO and PZT grow as randomly oriented polycrystallites. The test chips have capacitors ranging in size from 5×4 $\mu$m to 100×100 $\mu$m, but the data reported below was taken with 20×20 $\mu$m capacitors. An upper platinum contact layer 140 overlies the upper metal-oxide electrode layer 138. An interlevel dielectric layer 142 is formed over the structure in the area of the capacitor 110, and vias 144, 146 are etched through it to provide electrical contact of the metal interconnect 128 to the lower platinum layer 132 through the via 144 and of an unillustrated metallization to the top of the upper platinum layer 140 through via 146.

EXPERIMENT 4

Figure 9:
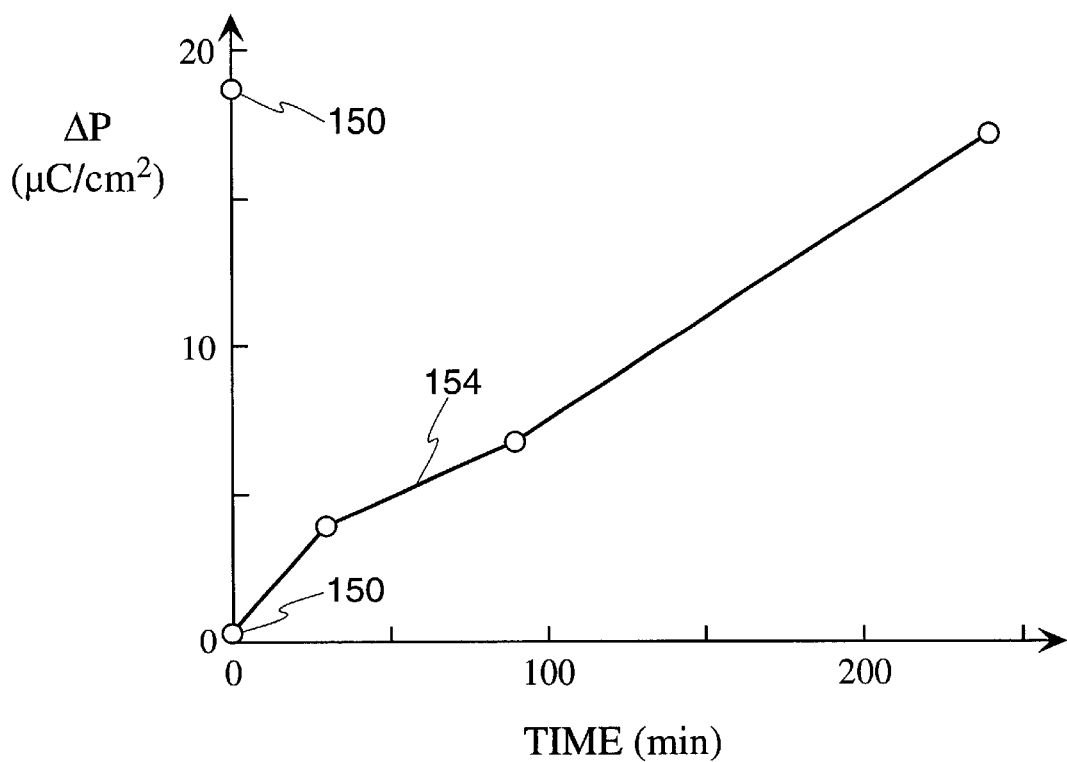
FIG. 9 is a graph showing the polarization effects of a forming-gas anneal followed by a nitrogen anneal.

The ferroelectric characteristics were first measured without a forming-gas anneal. As illustrated in the graph of FIG. 9, a base value 150 of the pulsed polarization is measured for 5V pulses to be about 19 $\mu C/cm^2$. The hysteresis curve (not illustrated) looks good and extends between ±40 $\mu C/cm^2$ when the voltage is swept between ±5V.

After completion of the illustrated structure, it was subjected to a forming-gas anneal with 4% $H_2$ in $N_2$ at 450° C. for 30 minutes, followed by a cool down to room temperature in a hydrogen-containing ambient. The polarization characteristics were then measured. The pulsed polarization, as indicated by value 152 in FIG. 9, is effectively zero. The hysteresis curve is almost circular, reaching values of ±110 $\mu C/cm^2$ for zero applied voltage. This behavior is not understood. Despite the presence of the LSCO upper electrode 138 in the structure of FIG. 8, which should provide some barrier effect, the platinum contact 140 catalyzes the molecular hydrogen into very mobile atomic hydrogen, which diffuses through the LSCO 138 to the underlying PZT layer 136. Thus, LSCO seems to act as a barrier to the forming gas only in the absence of overlying platinum.

After the forming-gas treatment, the structure was then reheated and subjected to a recovery anneal in ultrapure nitrogen at 450° C., followed by a cool down in nitrogen. The polarization characteristics were measured at 30, 90, 240, and 300 minutes. As shown by plot 154 in FIG. 9, the pulsed polarization shows a nearly linear recovery with nitrogen annealing time to almost the base value 150. After 300 minutes of recovery anneal, almost no difference is observed between the capacitors as grown and after they recovered. The measured hysteresis curves show a similar return to the base shape that the sample exhibited prior to the forming-gas anneal.

The experiments show that the recovery anneal can be separated in time from the forming-gas anneal, with perhaps additional structure added to the chip during the intervening period, but the cool down after the recovery anneal must not be at temperatures in the presence of hydrogen that would allow the reintroduction of hydrogen.

Other experiments show that a 500° C. nitrogen anneal for 30 minutes is almost as effective as a 400° C. anneal for 240 minutes. We believe that the high-temperature recovery anneal allows the hydrogen weakly bonded interstitially in the ferroelectric material to diffuse back out to the hydrogen-free recovery ambient. However, the hydrogen bonded to the previously dangling bonds at the silicon/silica interface is too tightly bonded to dissociate.

The nitrogen recovery ambient is essentially inert with respect to the hydrogen and other important species. Hence, argon or other inert gases such as helium or nitrogen could be substituted, or the recovery anneal could be performed in a high vacuum. The addition of small amounts of oxygen in the range of 1 ppm to 100 ppm by volume should facilitate the hydrogen removal from the ferroelectric because of chemical potential differences between the hydroxyl ion and free oxygen producing $H_2O$, but higher concentrations of oxygen may defeat the purpose of the forming-gas anneal of lying up excess oxygen at the silicon/silica interface. The inert gas should constitute at least 90% by volume of the ambient, and preferably at least 99%. The hydrogen content must be kept below 1% and preferably less than 1 ppm by volume (as adjusted to atmospheric pressure if the recovery anneal is performed in a partial vacuum) to qualify as a hydrogen-free environment. However, all these effects are dependent upon the temperature of the recovery anneal, which may be in the range of 200° to 600° C.

Although the samples of the above recovery anneal use LSCO electrodes surrounding a randomly oriented ferroelectric layer, the recovery anneal can be applied to other more conventional ferroelectric cells using other electrodes and those having either crystallographically oriented or randomly oriented ferroelectric layers since the recovery mechanism will be the same. An example of such a more conventional ferroelectric cell that may be recovered is given by the stack of TABLE 5.

TABLE 5

| Intermetallic |
|---|
| PZT |
| Pt |
| TiN or Ti |
| Polysilicon |
| Si |

In the absence of LSCO or other templating layer, the ferroelectric PZT grows as a randomly oriented polycrystallite. The TiN/Pt or Ti/Pt lower electrode is given as just an example and other configurations and compositions are possible. The absence of an upper platinum electrode is beneficial in preventing the incorporation of hydrogen, but the recovery anneal removes whatever hydrogen is nonetheless incorporated in the ferroelectric.

Although the invention was explained in the context of ferroelectric memories, ferroelectric materials can be used for other purposes in a silicon-based integrated circuit, for example, as a dielectric layer in capacitors not being used for memory effects. Other structures are known in which the ferroelectric serves as a gate electrode for a transistor or in which two electrodes are applied to the same side of the ferroelectric layer. The invention can be beneficially applied to these other ferroelectric structures.

One or more of the preceding methods and structures may be used to avoid or overcome the effects of the forming-gas anneal. With the variety of possible solutions, great freedom is available in choosing the composition, crystalline structure, and manufacturing method of the ferroelectric stack while still assuring its superior operation in conjunction with silicon circuitry. The invention enables the fabrication of large ferroelectric integrated memory cells.

What is claimed is:

1. A process for treating a substrate comprising a ferroelectric memory cell including a ferroelectric stack having a ferroelectric layer formed over a lower electrode layer and integrated on a silicon integrated circuit in said substrate, comprising the steps of:

after the formation of active circuits in said silicon integrated circuit and of oxide portions of said ferroelectric stack, a first step of annealing said substrate at an elevated first temperature in an environment containing hydrogen; and a subsequent second step of annealing said substrate at an elevated second temperature in a hydrogen-free environment, wherein said hydrogen-free environment is at essentially atmospheric pressure and comprises an oxygen content in the range of 1 to 100 ppm by volume.

2. A process for treating a substrate comprising a ferroelectric memory cell including a ferroelectric stack having a ferroelectric layer formed over a lower electrode layer and integrated on a silicon integrated circuit in said substrate, comprising the steps of:

after the formation of active circuits in said silicon integrated circuit and of oxide portions of said ferroelectric stack, a first step of annealing said substrate at an elevated first temperature in an environment containing hydrogen; and a subsequent second step of annealing said substrate at an elevated second temperature in a hydrogen-free environment, wherein said hydrogen-free environment comprises an oxygen content in the range of 1 to 100 ppm by volume when measured at atmospheric pressure.

3. A process for treating a substrate comprising a ferroelectric memory cell including a ferroelectric stack having a ferroelectric layer formed over a lower electrode layer and integrated on a silicon integrated circuit in said substrate, comprising the steps of:

after the formation of active circuits in said silicon integrated circuit and of oxide portions of said ferroelectric stack, a first step of annealing said substrate at an elevated first temperature in an environment containing hydrogen; and a subsequent second step of annealing said substrate at an elevated second temperature in a hydrogen-free environment, thereby recovering polarization characteristics of said ferroelectric memory cell degraded in said first annealing step, wherein said hydrogen-free environment comprises a chemically inert gas and oxygen having a concentration of between 1 to 100 ppm by volume to said inert gas.

4. A process for treating a substrate comprising a ferroelectric memory cell including a ferroelectric stack having a ferroelectric layer formed over a lower electrode layer and integrated on a silicon integrated circuit in said substrate, comprising the steps of:

after the formation of active circuits in said silicon integrated circuit and of oxide portions of said ferroelectric stack, a first step of annealing said substrate at an elevated first temperature in an environment containing hydrogen; and a subsequent second step of annealing said substrate at an elevated second temperature in a hydrogen-free environment, wherein said hydrogen-free environment comprises at least 90% by volume of a chemically inert gas.

5. The process of claim 4, wherein said hydrogen-free environment comprises no more than 100 ppm by volume of oxygen.

6. The process of claim 4, wherein said chemically inert gas comprises argon.

7. The process of claim 4, wherein said hydrogen-free environment comprises no more than 1% of hydrogen by volume.

* * * * *